United States Patent [19]

Engemann

[11] Patent Number: 5,021,919

[45] Date of Patent: Jun. 4, 1991

[54] DEVICE FOR THE GENERATION OF ELECTRICALLY CHARGED AND/OR UNCHARGED PARTICLES

[75] Inventor: Jurgen Engemann, Wuppertal, Fed. Rep. of Germany

[73] Assignee: Leybold Aktiengesellschaft, Fed. Rep. of Germany

[21] Appl. No.: 420,243

[22] Filed: Oct. 12, 1989

[30] Foreign Application Priority Data

Oct. 14, 1988 [DE] Fed. Rep. of Germany ....... 3834984

[51] Int. Cl.⁵ ....................... H05H 13/00; H01J 15/02; H01J 7/24; C23C 14/35

[52] U.S. Cl. ............................... 361/225; 204/298.38; 156/345; 328/230; 315/111.41; 313/361.1

[58] Field of Search ................... 361/225; 204/298.37, 204/298.38; 156/345; 219/121.52, 10.55 A, 10.55 R; 328/230; 315/111.01-111.91; 313/361.1, 363.1, 359.1

[56] References Cited

U.S. PATENT DOCUMENTS

| | | | |
|---|---|---|---|
| 3,778,656 | 12/1973 | Fremiot et al. | 313/63 |
| 4,277,304 | 7/1981 | Horiike et al. | 156/345 |
| 4,342,009 | 7/1982 | Dixon, Jr. | 331/107 DP |
| 4,438,368 | 3/1984 | Abe et al. | 315/111.61 |
| 4,450,031 | 5/1984 | Ono et al. | 156/345 |
| 4,484,161 | 11/1984 | Barger | 333/202 |
| 4,492,610 | 1/1985 | Okano et al. | 204/298.38 |
| 4,559,100 | 12/1985 | Ninomiya | 204/298.37 |
| 4,582,997 | 4/1986 | Jacquot | 315/111.81 |
| 4,638,216 | 1/1987 | Delaunay et al. | 315/111.91 |
| 4,673,456 | 6/1987 | Spencer et al. | 204/298.38 |
| 4,727,293 | 2/1988 | Asmussen et al. | 204/298.38 |
| 4,745,337 | 5/1988 | Pichot et al. | 315/111.41 |
| 4,778,561 | 10/1988 | Ghanbari | 204/298.38 |
| 4,831,963 | 5/1989 | Saito et al. | 204/298.38 |
| 4,853,102 | 8/1989 | Tateishi et al. | 204/298.37 |
| 4,857,809 | 8/1989 | Torii et al. | 315/111.81 |
| 4,859,303 | 8/1989 | Kalnitsky et al. | 156/345 |
| 4,876,983 | 10/1989 | Fukuda et al. | 204/298.38 |
| 4,948,458 | 8/1990 | Ogle | 156/643 |

FOREIGN PATENT DOCUMENTS

| | | | |
|---|---|---|---|
| 0157216 | 10/1985 | European Pat. Off. . | |
| 0285326 | 10/1988 | European Pat. Off. . | |
| 0286132 | 10/1988 | European Pat. Off. . | |
| 0018131 | 1/1986 | Japan | 156/345 |
| 2161653A | 1/1986 | United Kingdom . | |

OTHER PUBLICATIONS

Burke and Pomot, "Microwave Multipolar Plasma for Etching and Deposition", *Solid State Technology*, (Feb. 1988), pp. 67-71.

J. Helszajin, "YIG Resonators and Systems", *Electronic Engineering*, (Dec. 1983), pp. 47-50, 53, 54 and 56.

Patent Abstract of Japan E-285, Dec. 18, 1984, vol. 8, No. 277.

*Primary Examiner*—J. R. Scott

*Assistant Examiner*—Richard T. Elms

*Attorney, Agent, or Firm*—Lowe, Price, LeBlanc and Becker

[57] ABSTRACT

The invention relates to a device for the generation of electrically charged and/or uncharged particles in which into a cavity resonator (5) filled with a gas or gas mixture electromagnetic energy is introduced and in which a first magnetic field (19, 20) permeates the gas or gas mixture. With the aid of a second magnetic field ($H_{ext}$, 40, 41) permeating the gyromagnetic material the cavity resonator (5) is tuned. Usually, the tuning is carried out in such a manner that a hollow space resonator (5) which is loaded and mistuned by the plasma is again brought into resonance.

16 Claims, 3 Drawing Sheets

DEVICE FOR THE GENERATION OF ELECTRICALLY CHARGED AND/OR UNCHARGED PARTICLES

BACKGROUND OF THE INVENTION

1. Field of the Invention

This invention relates to method and apparatus for generating electrically charged or uncharged particles in an electron cyclotron resonator by generating a magnetic field for resonance tuning of the electron cyclotron resonator.

2. Description of the Prior Art

In the microstructure technique, for instance in the manufacture of semiconductor structural elements or in the coating of materials with thin films, charged and uncharged particles are necessary which are used for etching or coating. For the production of these charged and uncharged particles controllable plasma or ion sources which make available a maximum density of the particles required in each instance. For example, for many application cases it is desirable that ion densities of more than $10^{11}$ $cm^{-3}$ are permitted with acceptable density distribution within the plasma which for example corresponds to an argon ion saturation current density of more than 10 $mA/cm^2$.

In order to be able to fulfil these high requirements numerous plasma and ion sources have already been suggested which rest on the most diverse principles. With the more recent plasma and ion sources in particular the principle of the electron cyclotron resonance (=ECR) in the technical microwave frequency of 2.45 GHz is applied.

For example plasma processors are known which have a high-frequency waveguide in which a glass tube is disposed for the reception of the plasma wherein by means of current-carrying coils a magnetic field is generated permeating the plasma (DE-OS No. 37 29 347). Of disadvantage in such plasma processors is that substrates with large diameter cannot be worked uniformly with a plasma. In addition, the air-cored coil which must often be encapsulated water-tight and in a special steel has a very high power requirement.

Furthermore a multipolar microwave arrangement for the generation of plasma for etching and deposition is known in which the magnetic field which fulfills the ECR condition is present in the process chamber at a distance of only a few millimeters from each pole surface (R. Burke, C. Pomot: Microwave Multipolar Plasma for Etching and Deposition; Solid State Technology, February 1988, pages 67 to 71). Several cylindrical conductors of which each is disposed a few millimeters above the pole surface of a magnet function herein as feed of the microwave energy into the plasma. Of disadvantage in this only locally effective permanent magnet arrangement is that the ECR zones are only generated at the periphery of the particular plasma volumes. The ratio "ECR volume" to the total plasma volume with increasingly larger plasma sources is reduced to increasingly smaller values, i.e. this type of ECR excitation becomes more unfavorable with increasing size of the sources.

Lastly, a plasma source is also known which rests on the ECR principle and in which the microwave power is applied in a resonator with the plasma as load (USP 3 778 656). The tuning of this resonator, however, takes place purely mechanically in that for example a screw is turned into or out of the resonator.

SUMMARY OF THE INVENTION

The object of the invention is creating an ion and plasma source which requires relatively little energy even with large dimensions and which can be adjusted rapidly to its maximum degree of efficiency.

The invention is a method and a device for generating electrically charged or uncharged particles in an electron cyclotron resonator by generating a magnetic field for resonance tuning of the electron cyclotron resonator. In particular, the device comprises a hollow space resonator, means to introduce electromagnetic energy into the resonator and means to generate first and second magnetic fields. The first field permeates a gas or gas mixture in the hollow space resonator. As disclosed, the first field establishes electron cyclotron resonance (ECR). The second magnetic field provides resonance tuning of the hollow space resonator. Similarly, the method comprises the steps of introducing electromagnetic energy into the cavity resonator, and generating the first and second magnetic fields.

The object achieved with the invention is that the resonator when loaded by the plasma such that gyromagnetic structural elements in the resonator are detuned, can be brought very rapidly back to resonance by the tuning achieved by the second magnetic field. Pressure fluctuations, contaminations and the like during operation of the plasma source are rapidly balanced in this manner. In addition, it is possible to intentionally bring about a modulation of the plasma excitation.

BRIEF DESCRIPTION OF THE DRAWINGS

An embodiment example of the invention is represented in the drawing and is described below in greater detail.

DESCRIPTION OF THE PREFERRED EMBODIMENT

Figure 1:
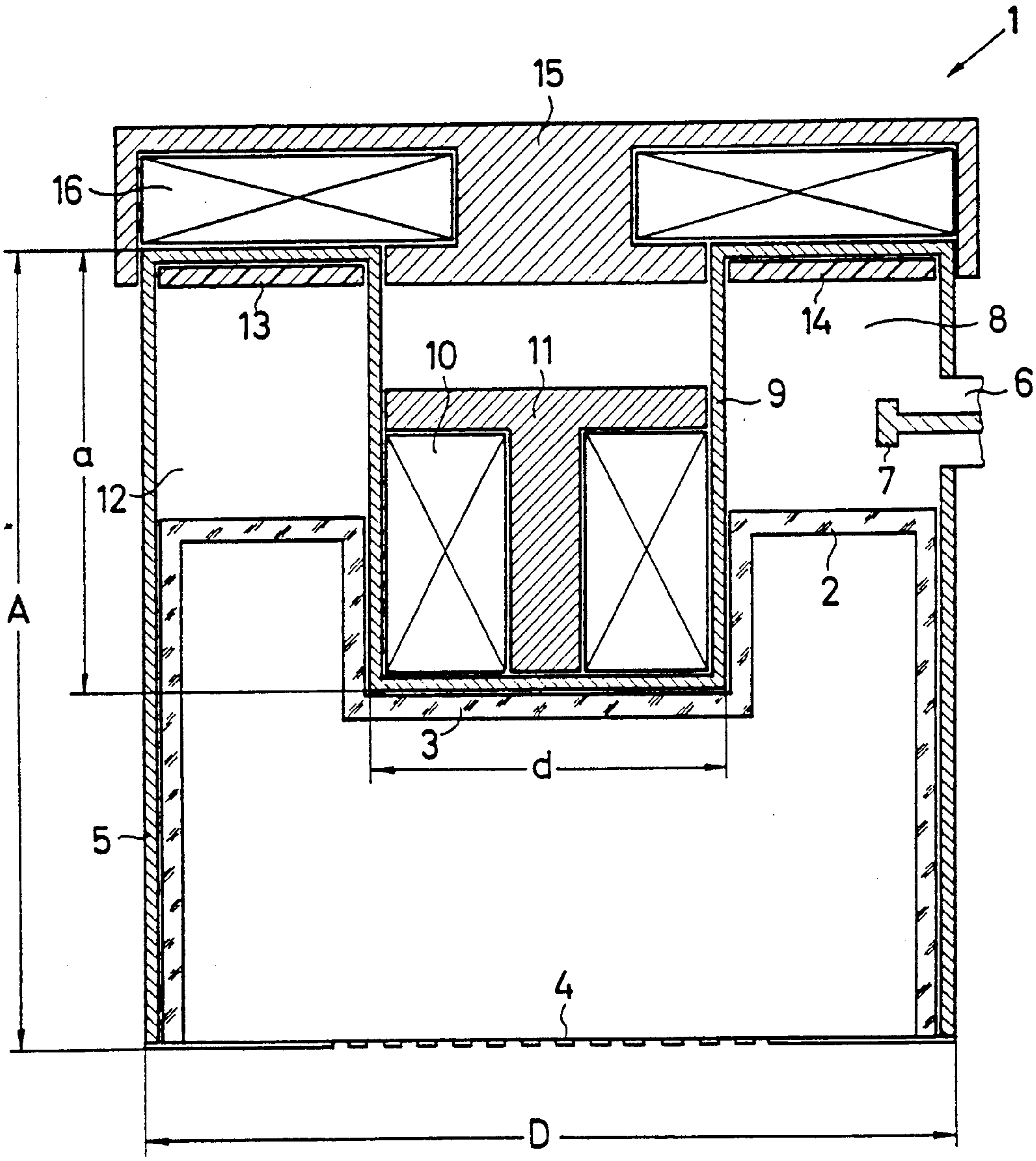
FIG. 1 shows a longitudinal section through a gyromagnetically tunable source for the generation of charged particles.

In FIG. 1 is shown a longitudinal section through a gyromagnetically tunable ion and plasma source 1 in which the principle of the electron cyclotron resonance is applied. This ion and plasma source 1 has a quartz vessel 2 for receiving a plasma which has on its upper side a depression 3 and on its under side is provided with an extraction grid with which ions can be drawn off. In a pure plasma extraction this grid 4 is omitted. Around the quartz vessel 2 a resonant cavity 5 is provided having an opening 6 through which a microwaves coupler 7 enters a space 8 located above the quartz vessel 2. Coupling-in the microwave can take place capacitively, inductively or via a line. FIG. 1 shows a capacitive coupling-in in which the end of an open line projects into a hollow space. Coupling-in advisably takes place where large electric field strengths occur.

The resonant cavity 5 is adapted to the depression 3 of the quartz vessel 2, i.e. it likewise has a depression 9 in which is located a ring-shaped coil 10 surrounding a perpendicular stay of a soft iron core 11 being T-shaped in cross section. This coil 10 serves to generate the electron cyclotron resonance condition. If the coupled-in microwave has a frequency {of} 2.45 GHz the magnetic flux density generated by the coil 10 is $8.75\times10^{-2}$ V-s/$m^2$ so that the ECR condition is fulfilled.

The resonant cavity 5 adapts essentially to the outer contours of the quartz vessel, wherein however in the upper region evident in the longitudinal sectional representation the two hollow spaces 8 and 12 are formed in the resonant cavity 5, which form a ring which at least partially surrounds the coil 10. This ring 8, 12 is closed off on its upper side with a thin ring 13, 14 of a gyromagnetic material, for example ferrite.

Above this ring 13, 14 and on the resonant cavity 5 is disposed a cylindrically symmetric soft iron core 15 into which a circularly annular tuning coil 16 is inserted for the gyromagnetic setting of the resonance frequency of the resonant cavity 5.

The resonant cavity 5 represents in the arrangement according to FIG. 1 a capacitively loaded resonator which toward the outside is completely closed off through conducting but magnetically non-shielding walls, for example of copper or aluminum. By varying the total height A of the resonant cavity 5 and/or the height a of the depression 9 projecting above the floor of the depression 3 and/or of the total diameter D of the resonant cavity 5 and/or of the diameter d of the depression 9 it is possible to vary a field configuration which is stable in the resonant cavity 5 as well as also a capacitive load in wide limits, and to adapt in this manner an optimal operating point of the plasma and ion source 1.

The coil 10 generates a cylindrically symmetric toroidal magnetic field of sufficient strength whose flux density for example with a fed-in microwave is determined by the formula $$B = 2\pi * \frac{m_e}{e} f$$

where $m_e$ is the mass of an electron, e the charge of an electron, and f the frequency of the fed-in microwave. This magnetic field extends also into the plasma chamber which is formed before the quartz vessel 2. Through different current supply of this coil 10 the internal zone in which the electron cyclotron resonance occurs can be set within given limits.

Permanent magnets in a multicusp arrangement, a lineal arrangement or in another suitable arrangement can be provided for the generation of an ECR magnetic field instead of a wound coil.

Essential for the invention is the gyromagnetic ring 13, 14 in connection with the coil 16 through whose magnetic field a turning of the resonant cavity 5 can be effected. As already stated, possible gyromagnetic rings 13, 14 are for example a ring of ferrite which have marked magnetic properties but only low conductivity so that in them a wave propagation is possible. Through the premagnetization of such ferrites the permeability or the dielectric constant can be varied; this is referred to as a gyromagnetic permeability or dielectric constant which can be described by a tensor. The resonant cavity 5 containing the gyromagnetic disks 13, 14 can consequently be tuned through the magnetic field of coil 16 via the change of permeability or dielectric constant wherein the quality {factor Q} or the resonance frequency or both can be changed within given limits. Magnetically tunable ferrimagnetic resonators are known to have in the frequency range between 300 MHz up to approximately 100 GHz a sufficiently high resonance quality for use as frequency-determining elements in tunable semiconductor oscillators and filters. The operational mechanism of the stated change of permeability rests on the excitation of the ferrimagnetic resonance in premagnetized ferrite spheres or disks through an AC magnetic field with a direction perpendicular to the premagnetization field. The ferrimagnetic resonance is linked directly as a solid-state effect with the gyroscopic properties of the electron spin which in the excited ferrite sample leads to a precessional motion of the rotational pulse axes of the electron spin about the direction of the premagnetization field which is also referred to as gyromagnetic effect (Meinke/Grundlach: Taschenbuch der Hochfrequenztechnik, 4th Edition, L 50, Point 9.8). The spin precessional resonance is linearly related with the premagnetization field via the gyromagnetic relation $\gamma=35.2$ KHz m/A.

This principle, known per se from the high-frequency technique for the electrical tuning of transmitters, is used according to the invention for the compensation of the resonance frequency shift of a resonant cavity resonantor loaded by a plasma. From the perturbation theory (R. F. Harrington: Time-Harmonic Electromagnetic Fields, McGraw-Hill Book Company, 1961, Chapter 7) follows for the resonance shift $\Delta\omega=\omega-\omega_o$ of a resonator loaded with a gyromagnetic material of volume $\Delta\tau$ $$\frac{\Delta\omega}{\omega_o} = -\frac{\int\int\int(\Delta\epsilon \cdot E \cdot E_o^* + \Delta\mu \cdot H \cdot H_o^*)d\tau}{\int\int\int(\epsilon \cdot E \cdot E_o^* + \mu \cdot H \cdot H_o^*)d\tau}$$

with $\omega_o$: resonance frequency of the unloaded resonator, i.e. no gyromagnetic material is present in the hollow space resonator;

$\Delta\omega$: shift of the resonance frequency;

$\epsilon,\mu$: high-frequency relative dielectric and permeability coefficient of an undisturbed substance within the resonator, i.e. no external electric and/or magnetic fields occur;

$\Delta\epsilon,\Delta\mu$: change of $\epsilon$ and $\mu$ due to external electric and/or magnetic fields;

E, H: electric and magnetic field respectively within the disturbed resonator, i.e. the resonator detuned through the gyromagnetic material;

$E_o^*$, $H_o^*$: complex-conjugate electric and magnetic fields respectively within the detuned resonator;

$d\tau$: space element of the resonator.

The greatest changes of the resonance frequency occur if the perturbation, i.e. the gyromagnetic material in the resonator, is localized at the site of maximum electric field strength E and vanishing magnetic field H or conversely.

If the ratio of volume $\Delta\tau$ of the gyromagnetic material to the total volume $\tau$ of the resonator is small, then with sufficient accuracy $E=E_o$ and $H=H_o$ applies. For E and H thus with good approximation the form-dependent inner fields in the gyromagnetic material $E_{int.}$ or $H_{int.}$ can be assumed.

The frequency shift which is set by a change of the relative dielectric coefficient which is given by $$\frac{\Delta\omega}{\omega_o} = -\frac{\int\int\int \Delta\epsilon \cdot E_{int.} \cdot E_o^* d\tau}{2\int\int\int \epsilon \cdot |E_o|^2 d\tau}$$

while the frequency shift resulting from a change of the permeability is defined by the equation:

$$\frac{\Delta\omega}{\omega_o} = -\frac{\int\int\int \Delta\mu \cdot H_{int.} \cdot H_o^* d\tau}{2\int\int\int \epsilon \cdot |H_o|^2 d\tau}$$

As a simplification herein in both cases the magnetic and the electric field energy in the denominator of the initial equation were equated with each other. The material composition, the shape, and the positioning of ring 13, 14 of gyromagnetic material were so chosen that $\Delta\omega/\omega_o$ assumes a maximum as a function of externally applied fields. Of importance for the technically significant frequency shift through a change of the high-frequency permeability are essentially the operating frequency $\omega$, the shaping of the gyromagnetic material, the positioning of the gyromagnetic material within the resonator, the operating mode of the resonator, the magnitude of the external static magnetic field, and the orientation of the external magnetic field vector relative to the high-frequency magnetic field vector, preferably of the main mode in the resonator.

Figure 2:
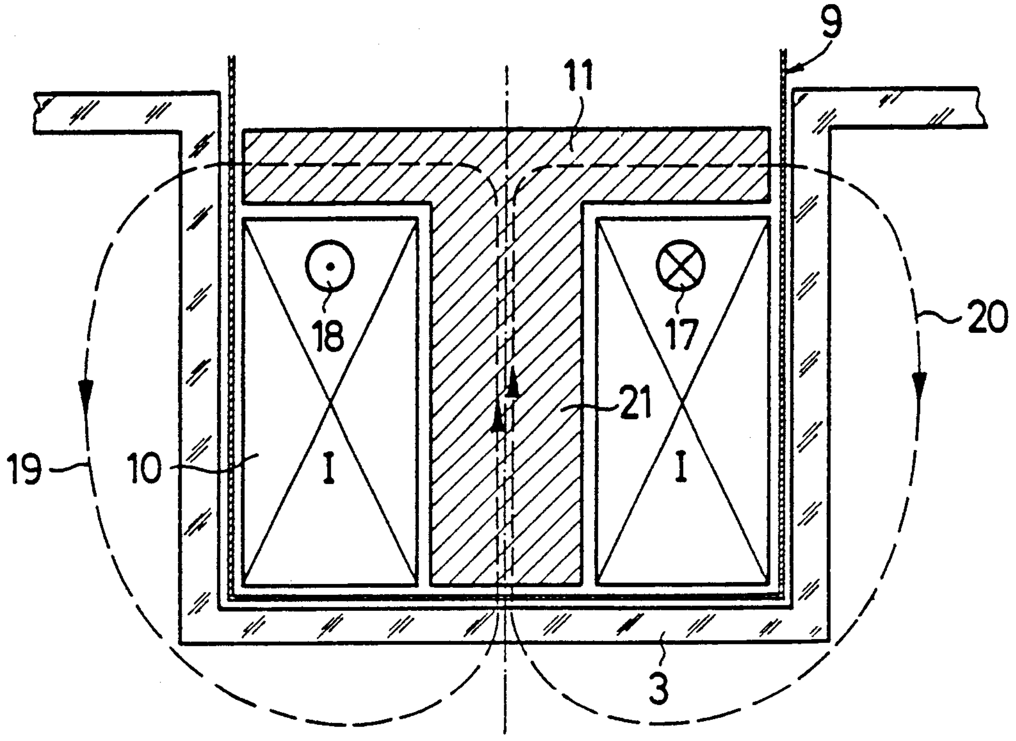
FIG. 2 shows a segment from a resonant cavity of the source according to FIG. 1.

In FIG. 2 the depression 3 of the quartz vessel 2, the coil 10, the soft iron core 11, and the depression 9 of the resonant cavity 5 are shown again in detail. The direction of the current flow through coil 10 is therein indicated by the symbols ⊙ and ⊗ at 17 and 18 respectively. The symbol at 17 herein signifies the current flowing in while the symbol at 18 signifies the current flowing out. Through this current flow a magnetic flux density B builds up which is represented schematically through lines 19, 20. It is evident herein that the flux density 20 extends on the right side in the clockwise direction. In contrast, the flux density 19 is counterclockwise. This means that the flux densities 19, 20 in the stay 21 of the T-shaped soft iron core 11 are additive. The current flowing through coil 10 is always a DC current so that the hereby generated magnetic field is also always a DC field.

Figure 3:
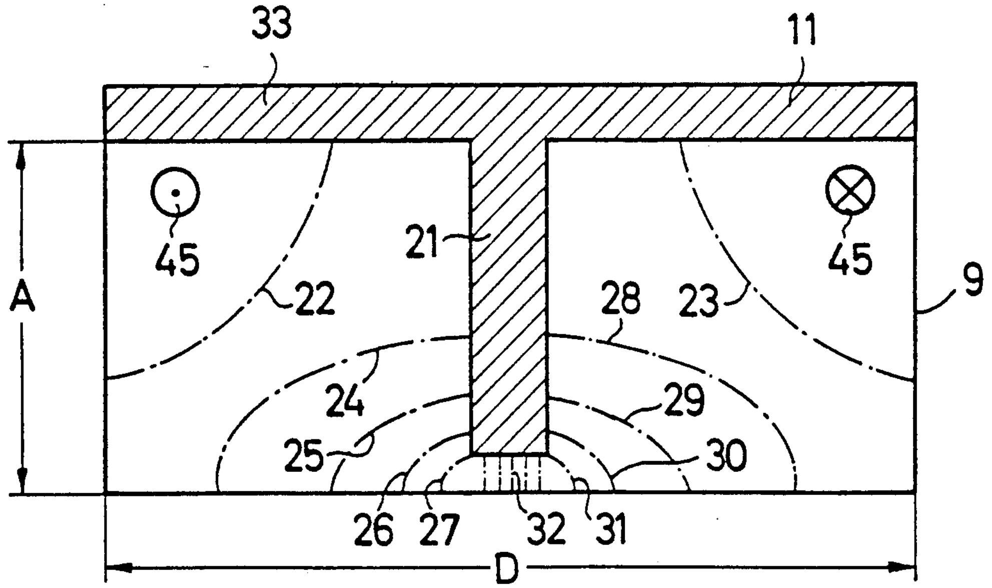
FIG. 3 shows the course of the electric and magnetic field lines of the main mode in a resonant cavity which has a width greater than its height.

The arrangement shown in FIG. 2 functions for the generation of a field strength for the electron cyclotron resonance and as such is not new in principle. Of significance is, however, that the coil 10 is disposed in the depression 3 and that the diameter D of the resonant cavity 5 to the height A of the resonant cavity 5 has a given ratio. If D is greater than A, the field distribution in the resonant cavity 5 appears as is shown in FIG. 3. It is evident herein that the electric field lines 22, 23 of the main mode of the microwave extend arcuatedly from the transverse stay 33 of the soft iron core toward the resonator wall 9 while other electric field lines 24 to 32 are directed from stay 21 of the soft iron core 11 to the extraction grid 4 (as shown in FIG. 1). The magnetic field lines, of which only one field line 45 is shown, extend circularly ring-shaped about the stay 21, i.e. at the upper edge of the resonant cavity 5 the magnetic field lines extend parallel to the resonant cavity plane.

Figure 4A:
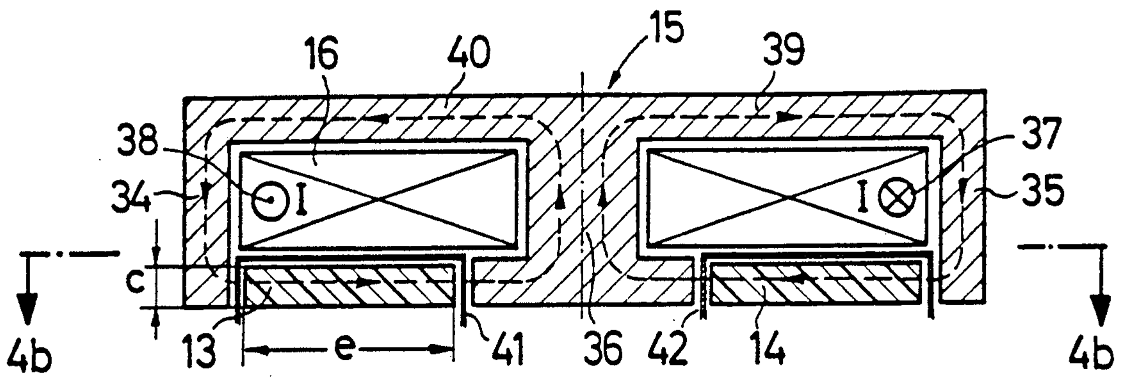
FIG. 4*a* shows a segment from the upper region of the resonant cavity according to FIG. 1.

At the upper edge of the resonant cavity 5 a gyromagnetic circular ring, of which are evident the two slices 13, 14, are placed so that the generated magnetic field 39, 40 effective in it extends perpendicularly to the magnetic field lines 45. How this external magnetic field 39, 40 is generated is shown in FIG. 4*a*. It is apparent in this representation that the soft iron core 15 has an essentially E-shaped cross section wherein between the outer stays 34, 35 of the E and about its center stay 36 the coil 16 is wound. The direction of the current I flowing through the coil 16 is represented by the symbols 37, 38 wherein the symbol 37 identifies the current flowing in and the symbol 38 the current I flowing out. Here too the current flowing though coil 16 is a DC current so that a DC magnetic field is generated. The magnetic field lines which build up are referred to with 39 and 40. It is evident that these field lines permeate and consequently premagnetize the ring 13, 14 of gyromagnetic material. The projections of the resonant cavity 5 are referred to as 41 and 42 wherein these projections represent, of course, annular structures.

Figure 4B:
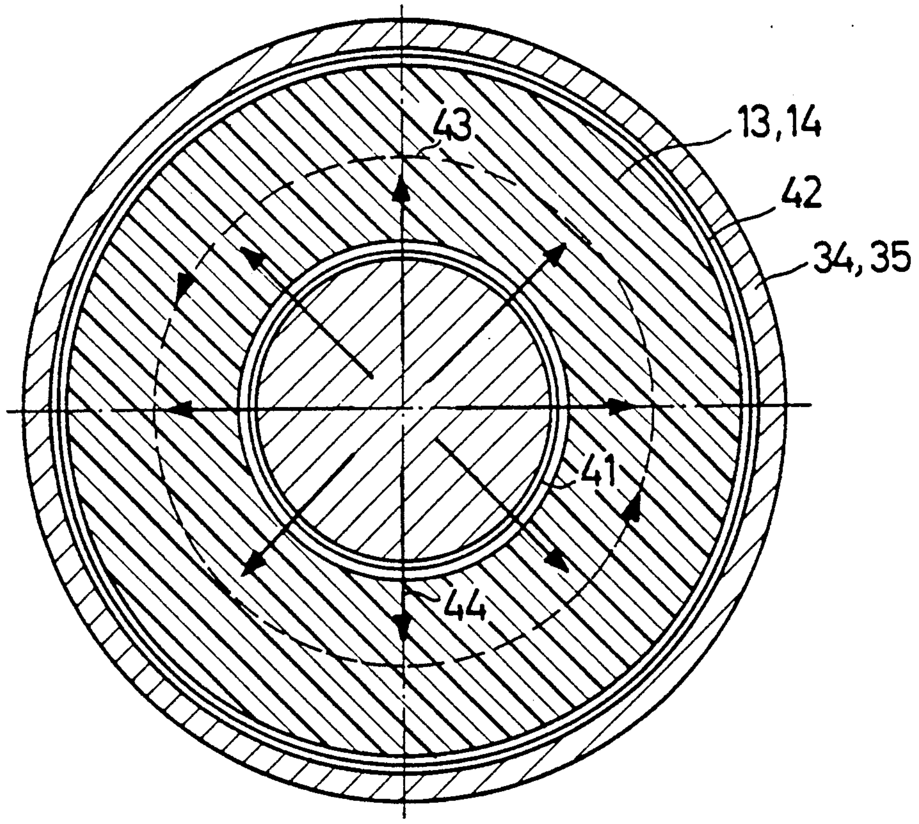
FIG. 4*b* shows a horizontal projection of the arrangement shown in FIG. 4*a*.

In FIG. 4*b* the arrangement of FIG. 4*a* is represented once again in a sectional horizontal projection wherein closely above the coil 16 a section is carried out. Ring 34, 35 is herein evident as a circular ring cross section of the soft iron core 15. The gyromagnetic material which was represented in FIG. 4*a* by two cross sections 13 and 14 is here clearly evident as circular ring 13, 14. The like applies to the projections 41, 42 of resonant cavity 5 which form two cylinder walls 41, 42 which enclose the gyromagnetic material. The magnetic field lines 43 of the fundamental mode of the fed-in microwave are therein indicated as a circle while the field lines of the external field $H_{ext}$ are labeled with 44 and extend radially from the inside to the outside. If e is the width of the circular ring 13, 14 and c its height, for $e<c$ and sufficient thickness c of the gyromagnetic material using ferrite, frequency detunings $|\Delta\omega|/\omega_o$ of the order of magnitude of 10% can be achieved. The static magnetic fields of the premagnetization through coil 16 required for this purpose lie at maximally 1 kilo Oersted (Oersted or "Oe" is a measure of magnetic field strength, i.e. 1 Oe=79.577 Amperes/Meter or 1 kOe=79,577 Amperes/Meter) and are technically realizable without problems.

The regulating device which varies the current through the coil 16 is not shown in detail. However, a regulating device can be used of the type customary in high-frequency techniques for the gyromagnetic tuning of transmitters.

When using permanent magnets instead of the electromagnets 15, 16 a rapid stabilizing of the loading of the resonant cavity 5 by the plasma is not readily possible. It would be conceivable, however, to approximate the individual magnets more or less to the soft iron core 15 by means of small motor drives. The motor drives can then be driven again with the same electrical signals as the coil 16.

I claim:

1. A device for generation of electrically charged or uncharged particles comprising:

a hollow space resonator;

means to introduce electromagnetic energy into said hollow space resonator;

means to generate a first magnetic field to permeate a gas or gas mixture in said hollow space resonator; and means to generate a second magnetic field for resonance tuning of said hollow space resonator.

2. A device as stated in claim 1, wherein the hollow space resonator comprises a resonant cavity in which is located at least one object of gyromagnetic material which is permeated by the second magnetic field.

3. A device as in claim 1 wherein the means to generate a second magnetic field comprises an electromagnet having a coil disposed in a magnetically conducting part, said magnetically conducting part having a slot in which is located an object of gyromagnetic material.

4. A device as in claim 1, wherein said hollow space resonator comprises a resonant cavity and a glass vessel for the reception of the charged or uncharged particles, said glass vessel having a closed upper side and a depression for receiving said means to generate a first magnetic field.

5. A device as in claim 4, wherein the glass vessel is surrounded by the resonant cavity and the resonant cavity substantially conforms to the contours of the glass vessel providing a free space solely in an area into which the electromagnetic energy is fed.

6. A device as in claim 5, further comprising a gyromagnetic material on an upper side of the free space facing away from the glass vessel.

7. A device as in claim 6, wherein:

the glass vessel and the resonant cavity are cylindrically symmetric, the gyromagnetic material has the form of a circular ring disposed on the upper side of the free space, and the circular ring of gyromagnetic material lies in a recess of a soft iron core which is acted upon by the field of a permanent or electromagnet.

8. A device as in claim 4, wherein the generator of the first magnetic field comprises an electromagnet having a coil wound about a perpendicular shank of a T-shaped soft iron core, wherein the transversely extending portion of the core extends parallel to a floor of the depression of the glass vessel.

9. A device as in claim 4, wherein the glass vessel is closed with an extraction grid on its under side.

10. A device as in claim 5, wherein the resonant cavity has a diameter D and a height A, and the depression of the resonant cavity has a diameter d and a height a, and the approximate condition $A=2a$ or $D=2d$ applies.

11. A device as in claim 2, wherein the resonant cavity has a gap for the coupling-in of the electromagnetic energy.

12. A device as in claim 1, wherein said means to generate a second magnetic field comprises means for detection of the resonance condition, a coil and a gyromagnetic material, wherein in the absence of resonance the detection means influences the current flow through said coil in such manner that the magnetic field generated by this current flow permeates said gyromagnetic material such that the gyromagnetic material changes its magnetic properties and again restores the resonance condition.

13. In a device for generating electrically charged or uncharged particles comprising an electron cyclotron resonator, the improvement comprising:

means to generate a magnetic field for resonance tuning of said electron cyclotron resonator, wherein said means to generate a magnetic field for resonance tuning comprises at least one object of gyromagnetic material located in a cavity of said electron cyclotron resonator.

14. A method of generating electrically charged or uncharged particles comprising the steps of:

introducing electromagnetic energy into a cavity resonator;

generating a first magnetic field to permeate a gas or gas mixture in said resonator to produce electron cyclotron resonance; and magnetically tuning the resonance of said cavity resonator.

15. A method of generating electrically charged or uncharged particles as in claim 14, wherein the magnetic tuning step comprise the step of:

generating a second magnetic field.

16. A method of generating electrically charged or uncharged particles as in claim 15, wherein the magnetic tuning step further comprise the step of:

passing said second magnetic field through at least one object formed of gyromagnetic material located inside said cavity resonator.

* * * * *